US009583685B2

(12) United States Patent
Yoo et al.

(10) Patent No.: US 9,583,685 B2
(45) Date of Patent: Feb. 28, 2017

(54) LIGHT-EMITTING-DEVICE PACKAGE AND PRODUCTION METHOD THEREFOR

(71) Applicant: LUMENS CO., LTD., Yongin-si, Gyeonggi-do (KR)

(72) Inventors: Tae Kyoung Yoo, Seongnam-si (KR); Myeong Kook Gong, Yongin-si (KR); Yong Wook Cho, Yongin-si (KR); Min Pyo Kim, Ansan-si (KR); Sung Hwan Yoo, Seoul (KR); Kyoung Min Kim, Daejeon (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/163,878

(22) Filed: May 25, 2016

(65) Prior Publication Data
US 2016/0268489 A1    Sep. 15, 2016

Related U.S. Application Data

(62) Division of application No. 14/648,035, filed as application No. PCT/KR2013/010936 on Nov. 28, 2013, now Pat. No. 9,385,289.

(30) Foreign Application Priority Data

Nov. 28, 2012  (KR) .......................... 10-2012-0135772
Nov. 27, 2013  (KR) .......................... 10-2013-0145767

(51) Int. Cl.
*H01L 33/00*     (2010.01)
*H01L 33/60*     (2010.01)
(Continued)

(52) U.S. Cl.
CPC ............ *H01L 33/60* (2013.01); *H01L 33/486* (2013.01); *H01L 33/62* (2013.01);
(Continued)

(58) Field of Classification Search
CPC ....... H01L 33/60; H01L 33/62; H01L 33/486; H01L 2933/0058; H01L 2933/0066;
(Continued)

(56) References Cited

U.S. PATENT DOCUMENTS

| 7,547,923 | B2* | 6/2009 | Shin | H01L 33/483 257/93 |
| 2007/0221928 | A1* | 9/2007 | Lee | H01L 33/486 257/79 |
| 2009/0045423 | A1* | 2/2009 | Hashimoto | H01L 33/60 257/98 |
| 2010/0032705 | A1* | 2/2010 | Shin | H01L 33/486 257/99 |
| 2011/0058372 | A1* | 3/2011 | Lerman | F21V 29/70 362/235 |
| 2011/0128731 | A1* | 6/2011 | Lin | F21K 9/00 362/235 |
| 2011/0293926 | A1* | 12/2011 | Kobayashi | H01L 33/62 428/332 |

(Continued)

FOREIGN PATENT DOCUMENTS

KR   10-2006-0079214 A    7/2006
KR   10-2011-0030257 A    3/2011
(Continued)

OTHER PUBLICATIONS

International Search Report dated Mar. 31, 2014 in PCT/KR2013/010936, 2 pgs.

*Primary Examiner* — Victor A Mandala
(74) *Attorney, Agent, or Firm* — Ichthus International Law PLLC

(57) ABSTRACT

A light-emitting-device package according to one aspect of the present invention includes: a metal substrate; a light emitting device disposed on a first surface of the metal substrate and configured to emit at least ultraviolet light; a pair of electrodes disposed to be spaced apart from each other on at least the first surface of the metal substrate, and electrically connected to the light emitting device; and an insulating layer provided between the metal substrate and the pair of electrodes. UV reflectance of the first surface of the metal body is higher than UV reflectance of the pair of electrodes.

12 Claims, 15 Drawing Sheets

(51) Int. Cl.
*H01L 33/48* (2010.01)
*H01L 33/62* (2010.01)

(52) U.S. Cl.
CPC ............... *H01L 2224/48091* (2013.01); *H01L 2224/73265* (2013.01); *H01L 2933/0033* (2013.01); *H01L 2933/0058* (2013.01); *H01L 2933/0066* (2013.01)

(58) Field of Classification Search
CPC . H01L 2224/48091; H01L 2224/73265; H01L 2933/0033
See application file for complete search history.

(56) References Cited

U.S. PATENT DOCUMENTS

| | | | | |
|---|---|---|---|---|
| 2012/0132937 A1* | 5/2012 | Chan | ................... | H01L 25/0753 257/89 |
| 2013/0015478 A1* | 1/2013 | Oh | ........................... | H05K 1/05 257/98 |
| 2013/0049564 A1* | 2/2013 | Jung | ................... | H01S 5/02469 313/45 |

FOREIGN PATENT DOCUMENTS

| KR | 20-0454785 Y1 | 7/2011 |
|---|---|---|
| KR | 10-2012-0062928 A | 6/2012 |

* cited by examiner

LIGHT-EMITTING-DEVICE PACKAGE AND PRODUCTION METHOD THEREFOR

CROSS-REFERENCE TO RELATED APPLICATION(S)

This application is a divisional of U.S. application Ser. No. 14/648,035, filed May 28, 2015, and issued as U.S. Pat. No. 9,385,289 on Jul. 5, 2016, which is the National Stage of International Application No. PCT/KR2013/010936, filed Nov. 28, 2013, claiming priority to Korean Patent Application No. 10-2012-0135772, filed on Nov. 28, 2012, and Korean Patent Application No. 10-2013-0145767, filed Nov. 27, 2013, the entire contents of which are incorporated herein by reference in their entirety.

TECHNICAL FIELD

The present invention relates to an electronic device, and particularly, to a light-emitting-device package.

BACKGROUND ART

In general, a light emitting device is used as a light source of a backlight module in an electronic device, for example, a display device, or a light source of a lighting device. The light emitting device may be packaged in various forms so as to be combined with the display device or mounted in the lighting device. Research on improving light emission efficiency according to light emitted in the light-emitting-device package has been conducted.

DISCLOSURE

Technical Problem

In order to improve light emission efficiency of a light emitting device emitting ultraviolet (UV) light emitting UV light among the light-emitting-device packages in the related art, it is necessary to optimize a material or a structure of a package considering reflectance of UV light.

An object of the present invention is to solve several problems including the aforementioned problems, and more particularly, to provide a light-emitting-device package capable of improving reflectance of ultraviolet light emitted from a light emitting device. However, the aforementioned objects are illustrative, and the scope of the present invention is not limited by the aforementioned objects.

Technical Solution

According to one aspect of the present invention, a light-emitting-device package includes: a metal substrate; a light emitting device that is disposed on a first surface of the metal substrate and emits at least ultraviolet light; a pair of electrodes spaced apart from each other on at least the first surface of the metal substrate, and electrically connected to the light emitting device; and an insulating layer between the metal substrate and the pair of electrodes. Ultraviolet reflectance of the first surface of the metal body is higher than ultraviolet reflectance of the pair of electrodes.

In the light-emitting-device package, 70% or more but less than 100% of the entire area of a light emitting surface of the first surface of the metal substrate involved in ultraviolet-light emission or reflection may be exposed from the pair of electrodes and the insulating layer.

In the light-emitting-device package, reflectance of the metal substrate with respect to ultraviolet light in a wavelength range from 200 nm to 380 nm may be 85% or more but less than 100%.

In the light-emitting-device package, the metal substrate may include aluminum. Further, the insulating layer may include an aluminum oxide formed by anodizing the aluminum of the metal substrate.

In the light-emitting-device package, the aluminum on at least a seating surface of the metal substrate may be exposed from the pair of electrodes and the insulating layer on the seating surface, so that 85% or more of ultraviolet light incident into or reflected from the seating surface may be reflected or re-reflected from the seating surface.

In the light-emitting-device package, the first surface of the metal substrate may be flat.

In the light-emitting-device package, the metal substrate may include a cavity in a direction of the first surface, the light emitting device may be mounted on a bottom surface within the cavity, and the light emitting surface may include the bottom surface and a lateral surface within the cavity.

In the light-emitting-device package, the insulating layer and the pair of electrodes may be disposed outside the cavity.

In the light-emitting-device package, the insulating layer and the pair of electrodes are extended from the first surface of the metal substrate and onto, a second surface opposed to the first surface.

According to another aspect of the present invention, a light-emitting-device package may include: a metal substrate; an insulating layer that covers the Metal substrate; an aluminum reflective layer on a light emitting device seating part of the insulating layer; a first electrode layer provided at one side of the insulating layer; a second electrode layer provided at the other side of the insulating layer; and a light emitting device that is seated on the light emitting device seating part, and is electrically connected to the first electrode layer and the second electrode layer.

In the light-emitting-device package, the metal substrate may include an aluminum component, and the insulating layer may be an aluminum oxide layer.

In the light-emitting-device package, the aluminum reflective layer may be in a substantially circular shape or a quadrangular shape and disposed around a rear surface of the light emitting device so as to reflect light generated by the light emitting device.

In the light-emitting-device package, the aluminum reflective layer may be provided between the first electrode layer and the insulating layer so as to be electrically connected to the first electrode layer.

In the light-emitting-device package, the aluminum reflective layer may be provided with an electrode separation line at a center portion of the aluminum reflective layer so as to be insulated from the second electrode layer, and include a first reflective layer installed at one side and a second reflective layer at the other side, relative to the electrode separation line.

In the light-emitting-device package, the first electrode layer may be disposed on the insulating layer in a shape extending from one side of a front surface of the metal substrate to one side of a rear surface of the metal substrate, and the second electrode layer may be disposed on the insulating layer in a shape extending from the other side of the front surface of the metal substrate to the other side of the rear surface of the metal substrate.

In the light-emitting-device package, the metal substrate may include two or more marginal protrusions that protrude by a marginal length from a lateral surface at a lateral side.

According to still another aspect of the present invention, a light-emitting-device package may include: a metal substrate; an insulating layer that covers the metal substrate; a light emitting device seated on a light emitting device seating part of the insulating layer; a first electrode layer provided at one side of the insulating layer and electrically connected to the light emitting device; a second electrode layer provided at the other side of the insulating layer and electrically connected to the light emitting device; and marginal protrusions provided at a lateral side of the metal substrate, and protruding by a marginal length from a lateral surface of the metal substrate in a lateral direction.

According to yet another aspect of the present invention, a method of manufacturing a light-emitting-device package may include: preparing a metal substrate strip including aluminum; oxidizing the metal substrate strip so that an insulating layer is formed on the metal substrate strip; forming an aluminum reflective layer on a light emitting device seating part of the insulating layer; providing a first electrode layer at one side of the insulating layer and providing a second electrode layer at the other side of the insulating layer; and seating a light emitting device on the light emitting device seating part.

The method of manufacturing the light-emitting-device package according to the aspect of the present invention may further include cutting the metal substrate strip so that marginal protrusions protruding by a marginal length from a lateral surface of the metal substrate in a lateral direction are formed at a lateral side of the metal substrate strip.

Advantageous Effects

According to the light-emitting-device packages according to the exemplary embodiments of the present invention, which is configured as described above, the metal substrate having high reflectance with respect to UV light is exposed from the light emitting surface within the package, so that it is possible to improve UV light emission efficiency of the package. The effect is described for illustration, and the scope of the present invention is not limited by the effects.

BEST MODE

Figure 1:
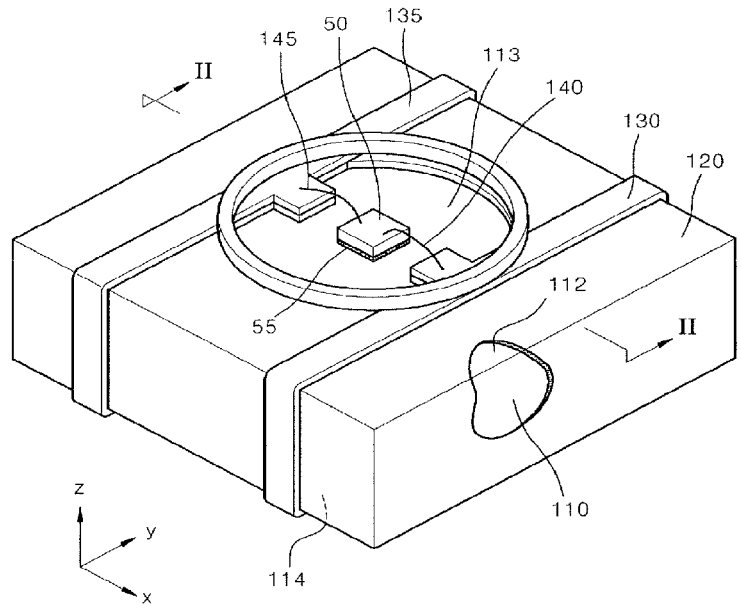
FIG. 1 is a schematic perspective view illustrating an ultraviolet light-emitting-device package according to an exemplary embodiment of the present invention.

Hereinafter, exemplary embodiments of the present invention will be described in detail with reference to the accompanying drawings. However, the present invention is not limited to exemplary embodiments to be disclosed below, but may be implemented in various forms different from each other, and the exemplary embodiments are provided so as to completely disclose the present invention and make those skilled in the art fully recognize the scope of the invention. Further, for convenience of the description, sizes of constituent elements may be exaggerated or decreased in the drawings.

In the exemplary embodiments below, an x-axis, a y-axis, and a z-axis are not limited to three axes on an orthogonal coordinate system, and may be interpreted as a broad meaning including the three axes on the orthogonal coordinate system. For example, the x-axis, the y-axis, and the z-axis may be orthogonal to one another, but may also refer to different directions which are not orthogonal to one another.

Figure 2:
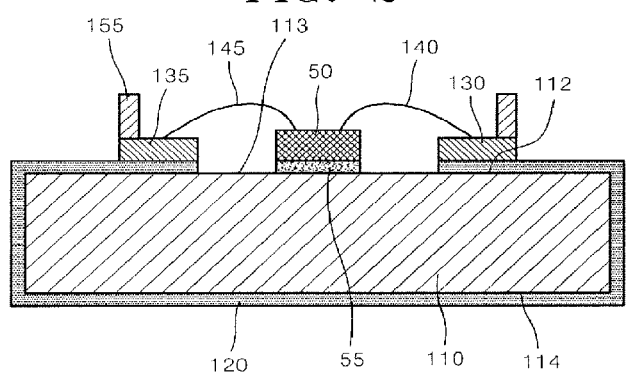
FIG. 2 is a cross-sectional view taken along line II-II of the ultraviolet light-emitting-device package of FIG. 1.

FIG. 1 is a schematic perspective view illustrating an ultraviolet light-emitting-device package according to an exemplary embodiment of the present invention. FIG. 2 is a cross-sectional view taken along line II-II of the ultraviolet light-emitting-device package of FIG. 1.

Referring to FIGS. 1 and 2, a light emitting device 50 may be disposed on a metal substrate 110. For example, the light emitting device 50 may be mounted on the metal substrate 110 with an adhesive member 55 interposed therebetween. The light emitting device 50, which is a device for receiving an electric signal and emitting light, may be used as a light source of various electronic devices, for example, a display device or a lighting device. For example, the light emitting device 50 may be formed of a diode of a compound semiconductor, and the light emitting device 50 may be called a light emitting diode (LED).

In the exemplary embodiment, the light emitting device 50 may emit at least ultraviolet (UV) light, and also be called a UV LED from the point of mainly emitting UV light. Here, UV light may refer to short wavelength light in a wavelength range from 10 to 380 nm, and more specifically, may also refer to far ultraviolet light in a wavelength from 200 nm to 380 nm. For example, the light emitting device 50 for emitting UV light may be manufactured by using a nitride-based compound semiconductor, such as GaN, AlGaN, InGaN, and InAlGaN.

The metal substrate 110 may serve as a substrate in which the light emitting device 50 is mounted, and approximately form an appearance of the package. The metal substrate 110 may include a first surface 112 on which the light emitting device 50 is seated, and a second surface 114 at an opposite side of the first surface 112. In the present exemplary embodiment, the first surface 112 may be flat, and thus, light, that is, UV light, emitted from the light emitting device 50, may be emitted upwardly from the first surface 112, approximately in a +z-axis direction. For example, a part of a corner portion is cut and illustrated in FIG. 1 so as to expose the first surface 112.

The metal substrate 110 may be formed of a metal material so as to increase reflection of UV light emitted from the light emitting device 50 and effectively emit heat generated by the light emitting device 50 to the outside. For example, the metal substrate 110 may include a metal having reflectance of 85% or more and less than 100% in a wavelength range of short wavelength UV light from 10 to 380 nm, particularly, in a wavelength range of far wavelength UV light from 200 to 380 nm. In order to sufficiently re-reflect UV light re-reflected to the metal substrate 110 and improve light emission efficiency of the UV light, UV reflectance of the metal substrate 110 needs to be 85% or more.

Figure 10:
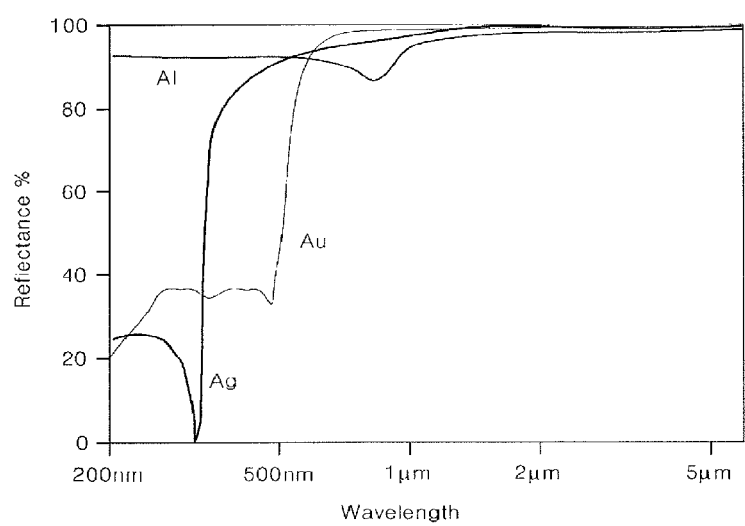
FIG. 10 is a graph illustrating reflectance according to an electrode metal.

For example, the metal substrate 110 may include aluminum (Al) having high thermal conductivity and high UV reflectance. As illustrated in FIG. 10, aluminum shows high reflectance in a UV wavelength range, as well as a visible light wavelength range. Particularly, it can be seen that aluminum has high reflectance of 85% or more with respect to UV light in the wavelength range of 200 to 380 nm. By contrast, gold (Au) shows high reflectance with respect to light having a relatively large wavelength range, but shows low reflectance of 40% or less with respect to light in a wavelength of 500 nm or less. Silver (Au) shows high reflectance of 85% or more with respect to visible light in a wavelength of 400 nm or more, but shows reflectance of less than 85% with respect to UV light in a wavelength of 380 nm or less, and particularly, shows low reflectance of 30% or less around a wavelength of about 300 nm and in a wavelength of about 300 nm or less.

In the meantime, in a modified example of the present exemplary embodiment, a center portion of the second surface 114 at the opposite side of the first surface 112 of the metal substrate 110 has a concavo-convex structure to increase a surface area thereof, so that heat generated by the light emitting device 50 may be effectively emitted to the outside.

A pair of electrodes 130 and 135 may be disposed to be spaced apart from each other on at least the first surface 112 of the metal substrate 110. The electrodes 130 and 135 may be electrically connected to parts of the light emitting device 50 having different polarities to serve as input/output terminals of the light emitting device 50. For example, the electrodes 130 and 135 may be disposed on the first surface 112 of the metal substrate 110 so as to have a predetermined pattern, and for example, center portions of the electrodes 130 and 135 may approximately have shapes protruding toward the light emitting device 50 so as to be connected with the light emitting device 50. Further, the electrodes 130 and 135 may be further extended onto the second surface 114 from the first surface 112 along both lateral walls.

A dam structure 115 may be disposed on the electrodes 130 and 135 so as to limit a light emitting part. For example, the dam structure 155 may be disposed on the electrodes 130 and 135 to have a ring shape surrounding the light emitting device 50. Accordingly, an internal region of the dam structure 155 may be a light emitting part in that the internal region of the dam structure 155 is associated with light emission or reflection of the light emitting device 50. In the meantime, when light emitted from the light emitting device 50 is reflected in a direction of the light emitting device 50, the light may be re-reflected from the internal portion of the dam structure 155 of the first surface 112, that is, a light emitting surface 113, to a target direction, that is, approximately in the +Z-axis direction. Accordingly, the light emitting surface 113 may be associated with light emission and/or reflection of the light emitting device 50.

Insulating layers 120 and 125 may be provided between the metal substrate 110 and the electrodes 130 and 135 so as to insulate the metal substrate 110 from the electrodes 130 and 135. For example, the insulating layers 120 and 125 may be formed on the metal substrate 110, and the electrodes 130 and 135 may be formed on the insulating layers 120 and 125. In this case, the electrodes 130 and 135 may be formed so as to be disposed within the insulating layers 120 and 125 or formed so as to overlap the insulating layers 120 and 125 according to a manufacturing method.

At least a pair of bonding wires 140 and 145 may connect the light emitting device 50 with the electrodes 130 and 135. Accordingly, the light emitting device 50 may be electrically connected with an external device through the bonding wires 140 and 145 and the electrodes 130 and 135.

In addition, in order to protect the light emitting device 50 from external moisture, and the like, a filler (not illustrated) may be provided on the metal substrate 110 within the dam structure 155 so as to cover the light emitting device 50. In view of a point that the light emitting device 50 emits UV light, and the UV light is used as a light source as it is, a fluorescent substance may be omitted from the filler. However, exceptionally, when the light emitting device 50 includes another light other than UV light, an appropriate fluorescent substance may be added into the filler in order to control the light.

In the UV light-emitting-device package according to the present exemplary embodiment, UV reflectance of the first surface 112 of the metal substrate 110 may be selected to be higher than UV reflectance of the electrodes 130 and 135 and the insulating layers 120 and 125. Accordingly, at least 70% or more of an entire area of the light emitting surface 113 involved in UV light emission or reflection needs to be exposed from the electrodes 130 and 135 and the insulating layers 120 and 125. In the present exemplary embodiment, the insulating layers 120 and 125 are removed from the light emitting surface 113 other than the portions, in which the electrodes 130 and 135 are disposed, in the dam structure 155, so that the metal substrate 110 may be exposed.

That is, 70% or more of the light emitting surface is exposed with aluminum having high reflectance with respect to UV light, thereby sufficiently improving UV light emission efficiency of the UV light-emitting-device package. However, in view of a point that the light emitting device 50 is seated on the first surface 112, an exposure area of the light emitting surface 113 may be difficult to be 100% even when the electrodes 130 and 135 and the insulating layers 120 and 125 are not disposed on the first surface 112.

In the present exemplary embodiment in order to increase an exposure area of the aluminum material on the first surface 112 of the metal substrate 110, the electrodes 130 and 135 may be restricted at an edge portion of the first surface 112 and formed in a stripe shape extended in, for example, a +y-axis direction. As a modified example of the present exemplary embodiment, in order to decrease connection lengths by the bonding wires 140 and 145, the electrodes 130 and 135 may also be formed in stripe shapes extended in a longitudinal direction, for example, a +x-axis direction, at both sides of the light emitting device 50. In another modified example of the present exemplary embodiment, the insulating layers 120 and 125 and the electrodes 130 and 135 may be modified to have various shapes within a range occupying an area of 30% or less of the light emitting surface 113.

Hereinafter, a method of manufacturing the UV light-emitting-device package according to the present exemplary embodiment will be described.

First, the metal substrate 110 having the first surface 112 and the second surface 114 may be prepared. Next, the light emitting device 50 may be mounted on the first surface 112 of the metal substrate 110. Next, the insulating layers 120 and 125 may be formed on the metal substrate 110, and the metal layers 130 and 135 may be formed on the insulating layers 120 and 125.

For example, the insulating layers 120 and 125 may be formed of an appropriate insulating material, for example, an oxide or a nitride. For example, the insulating layers 120 and 125 may be formed by using an anodizing method, a printing method, a coating method, and the like. For example, when the metal substrate 110 is formed of an alumina material, an aluminum oxide, that is, an alumina layer, may be formed on the metal substrate 110 through an anodizing treatment. For example, a mask pattern for anti-oxidation may be formed before the anodizing treatment, so that it is possible to form the insulating layers 120 and 125 formed of the alumina material by the anodizing treatment. For another example, the insulating layers 120 and 125 may also be formed by patterning the alumina layer by an appropriate method after the anodizing treatment.

The electrodes 130 and 135 may be formed on the insulating layers 120 and 125 by using a printing method, a plating method, or the like. For example, the electrodes 130 and 135 may be formed of a metal material, such as copper (Cu), and in order to improve reflectance, the electrodes 130 and 135 may be coated with a material having high reflectance, such as, silver (Ag), as necessary. For example, the electrodes 130 and 135 may be formed so as to be restricted within the insulating layers 120 and 125 by using a printing method. For another example, the insulating layers 120 and 125 and the electrodes 130 and 135, which are vertically aligned with each other, may also be formed by forming an alumina layer by using the anodizing method, forming a copper layer on the alumina layer by using a plating method, and then appropriately patterning the copper layer.

Next, the dam structure 155 may be formed on the electrodes 130 and 135, and the bonding wires 140 and 145 may be bonded so as to connect the light emitting device 50 with the electrodes 130 and 135. For example, an upper portion of the light emitting device 50 and upper portions of the electrodes 130 and 135 may be connected by using a wire bonding method. The bonding wires 140 and 145 may include an appropriate conductive substance, for example, gold, silver, and copper.

Figure 3:
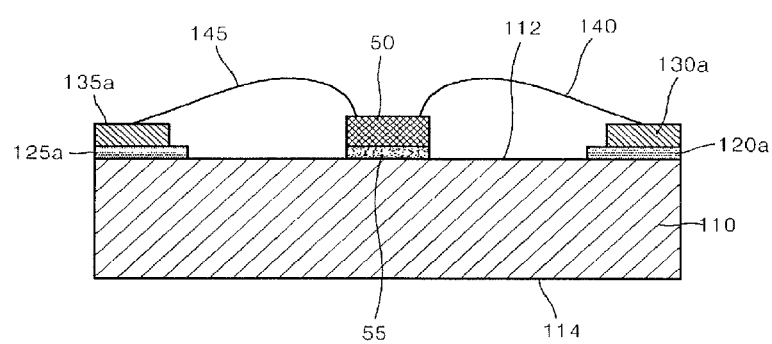
FIG. 3 is a schematic cross-sectional view illustrating a light-emitting-device package according to another exemplary embodiment of the present invention.

FIG. 3 is a schematic cross-sectional view illustrating a UV light-emitting-device package according to another exemplary embodiment of the present invention. Some configurations of the light-emitting-device package according to the present exemplary embodiment are modified from the UV light-emitting-device package of FIGS. 1 and 2, so that overlapping descriptions in the two exemplary embodiments will be omitted.

Referring to FIG. 3, insulating layers 120a and 125a and electrodes 130a and 135a may be disposed in stripe patterns at an edge portion on a first surface 112 of a metal substrate 110.

Figure 4:
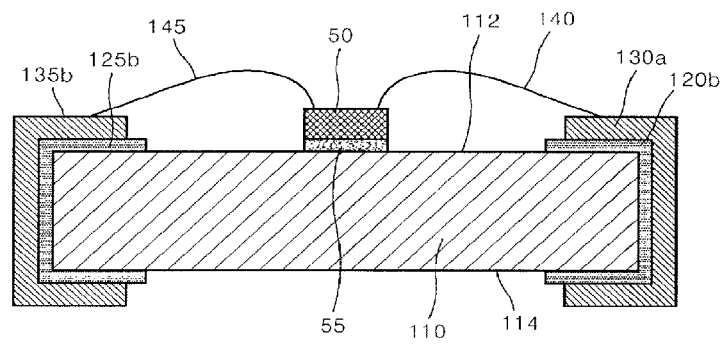
FIG. 4 is a schematic cross-sectional view illustrating a light-emitting-device package according to still another exemplary embodiment of the present invention.

FIG. 4 is a schematic cross-sectional view illustrating a UV light-emitting-device package according to still another exemplary embodiment of the present invention. Some configurations of the light-emitting-device package according to the present exemplary embodiment are modified from the UV light-emitting-device package of FIGS. 1 and 2, so that overlapping descriptions in the two exemplary embodiments will be omitted.

Referring to FIG. 4, insulating layers 120b and 125b and electrodes 130b and 135b may be extended from a first surface 112 of a metal substrate 110 onto a second surface 114 at an opposite side of the first surface 112. For example, the insulating layers 120b and 125b and the electrodes 130b and 135b may be extended from an edge portion of the first surface 112 of the metal substrate 110 onto an edge portion of the second surface 114 through a lateral surface of the metal substrate 110. By this configuration, when the UV light-emitting-device package is mounted on a board, such as a printed circuit board, portions of the electrodes 130b and 130b extended onto the second surface 114 may be contact points for connecting the printed circuit board and the package. Accordingly, the UV light-emitting-device package according to the present exemplary embodiment may be mounted and modulated in the printed circuit board, and the like without an additional connection means.

Figure 5:
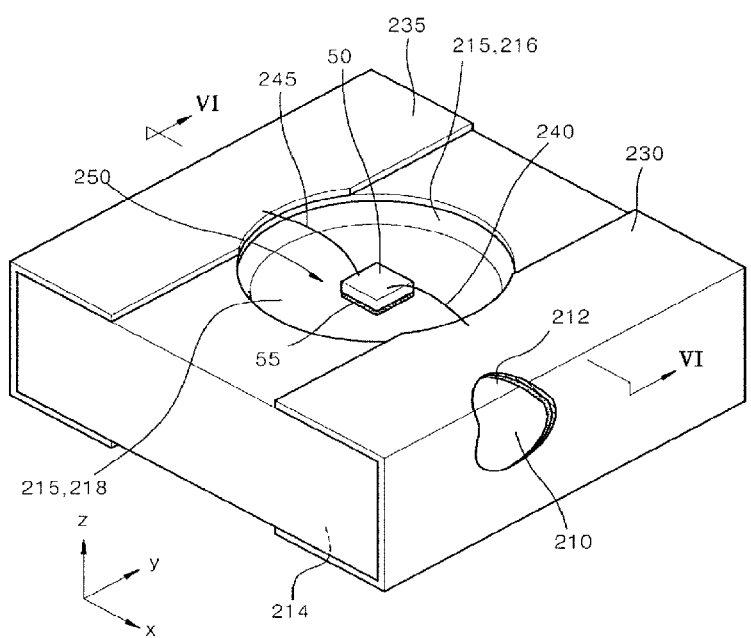
FIG. 5 is a schematic perspective view illustrating an ultraviolet light-emitting-device package according to yet another exemplary embodiment of the present invention.
Figure 6:
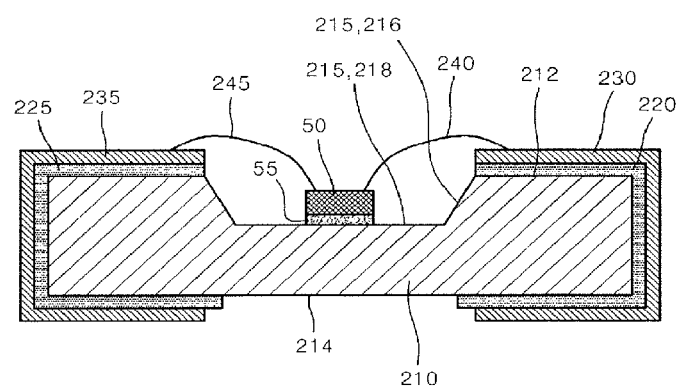
FIG. 6 is a cross-sectional view taken along line VI-VI of the UV light-emitting-device package of FIG. 5.

FIG. 5 is a schematic perspective view illustrating a UV light-emitting-device package according to yet another exemplary embodiment of the present invention. FIG. 6 is a cross-sectional view taken along line VI-VI of the ultraviolet light-emitting-device package of FIG. 5.

Referring to FIGS. 5 and 6, a light emitting device 50 may be disposed on a metal substrate 210. For example, the light emitting device 50 may be mounted on the metal substrate 210 with an adhesive member 55 interposed therebetween. The light emitting device 50 may mainly emit UV light, and in this case, the light emitting device 50 may also be called a UV LED.

The metal substrate 210 may serve as a substrate in which the light emitting device 50 is mounted, and approximately form an appearance of the package. The metal substrate 110 may have a first surface 212 on which the light emitting device 50 is seated, and a second surface 214 at an opposite side of the first surface 212. The metal substrate 210 may include a cavity 250 in a direction of the first surface 212, and the light emitting device 50 may be seated within the cavity 250. For example, the cavity 250 may be formed while being recessed from a protrusion portion of the first surface 212 in a direction of the second surface 214 by a predetermined depth, and thus, a concave portion 215 including a bottom surface 218 and a lateral surface 216 within the cavity 250 may be defined. By the cavity 250, the first surface 212 may be widely interpreted so that the first surface 212 includes a protruding surface at an external side of the cavity 250 and the bottom surface 218 and the lateral surface 216 within the cavity 250. For reference, in order to expose the first surface 212, a part of a corner portion is cut and illustrated in FIG. 5.

For example, the light emitting device 50 may be mounted on the bottom surface 218 within the cavity 250. Accordingly, light, for example, UV light, emitted from the light emitting device 50 may be directly emitted in an upper direction, that is, an approximately +Z-axis direction, of the first surface 212, or reflected from the lateral surface 216 of the concave portion 215 to be emitted in the upper direction. In this case, a light emitting surface related to UV light emission and/or reflection may include the bottom surface 218 and the lateral surface 216 within the cavity 250 as a narrow meaning. In addition, in view of a point that UV light reflected to the first surface 212 portion at the external side of the cavity 250 may be re-reflected again in the upper direction, the light emitting surface may widely mean to include the first surface 212 over an internal side and the external side of the cavity 250.

The metal substrate 210 may be formed of a metal material in order to improve reflection of UV emitted from the light emitting device 50, and effectively emit heat generated by the light emitting device 50 to the outside. For example, the metal substrate 210 may include aluminum (Al) having high thermal conductivity and high UV reflectance. A selection of a material of the metal substrate 210 may refer to the description of the metal substrate 110 of FIGS. 1 and 2.

In the meantime, in a modified example of the present exemplary embodiment, a center portion of the second surface 214 at an opposite side of the first surface 212 of the metal substrate 210 has a concavo-convex structure to increase a surface area thereof, so that heat generated by the light emitting device 50 may be effectively emitted to the outside.

A pair of electrodes 230 and 235 may be disposed to be spaced apart from each other on at least the first surface 212 of the metal substrate 210 with the cavity 250 interposed therebetween. The electrodes 230 and 235 may be electrically connected to parts of the light emitting device 50 having different polarities to serve as input/output terminals of the light emitting device 50. For example, the electrodes 230 and 235 may be disposed so as to have predetermined patterns on the protruding surface of the first surface 212 at the external side of the cavity 250. In the modified example of the present exemplary embodiment, the electrodes 230 and 235 may also be further extended to the lateral surface 216 of the concave portion 215 within the cavity 250, and even further, to the bottom surface 218.

Insulating layers 220 and 225 may be provided between the metal substrate 210 and the electrodes 230 and 235 so as to insulate the metal substrate 210 from the electrodes 230 and 235. For example, the insulating layers 220 and 225 may be formed on the metal substrate 210, and the electrodes 230 and 235 may be formed on the insulating layers 220 and 225. In this case, the electrodes 230 and 235 may be formed so as to be disposed within the insulating layers 220 and 225 or formed so as to overlap the insulating layers 220 and 225 according to a manufacturing method.

At least a pair of bonding wires 240 and 245 may connect the light emitting device 50 with the electrodes 230 and 235. Accordingly, the light emitting device 50 may be electrically connected with an external device through the bonding wires 240 and 245 and the electrodes 230 and 235.

In addition, in order to protect the light emitting device 50 from external moisture, and the like, a filler (not illustrated) may be provided on the metal substrate 210 within the cavity 250 so as to cover the light emitting device 50. In view of a point that the light emitting device 50 emits UV light, and the UV light is used as a light source as it is, a fluorescent substance may be omitted from the filler. However, exceptionally, when the light emitting device 50 includes another light other the UV light, an appropriate fluorescent substance may be added into the filler in order to control the light.

In the UV light-emitting-device package according to the present exemplary embodiment, UV reflectance of the first surface 212 of the metal substrate 210 may be selected to be higher than UV reflectance of the electrodes 230 and 235 and the insulating layers 220 and 225. Accordingly, 70% or more of an entire area of the light emitting surface involved in UV light emission or reflection, for example, the bottom surface 218 and the lateral surface 216 of the concave portion 215 in a narrow meaning, or the entire first surface 212 in a broad meaning needs to be exposed from the electrodes 230 and 235 and the insulating layers 220 and 225.

That is, only when 70% or more of the light emitting surface is exposed with aluminum having high reflectance with respect to UV light, it is possible to sufficiently improve UV light emission efficiency of the UV light-emitting-device package. In the meantime, in view of a point that the light emitting device 50 is seated on the first surface 212, an exposure area of the first surface 212 is difficult to be 100% even when the electrodes 230 and 235 and the insulating layers 220 and 225 are not disposed on the first surface 212.

For example, in order to increase an area of the light emitting surface, the insulating layers 220 and 225 and the electrodes 230 and 235 may be provided in predetermined patterns to the external side of the cavity 250. Shapes of the insulating layers 220 and 225 and the electrodes 230 and 235 may refer to the description about the insulating layers 120 and 125 and the electrodes 130 and 135 of FIGS. 1 and 2, and further, may be varied within a range occupying 30% or less of an area of the light emitting surface.

For another example, in order to make 85% or more of the UV light incident into or reflected from the seating surface be reflected or re-reflected to the seating surface, aluminum on at least the seating surface may be disposed on the seating surface of the metal substrate 110, for example, the bottom surface 218 of the concave portion 215, so that the aluminum on at least the seating surface is exposed from the electrodes 130 and 135 and the insulating layers 120 and 125.

Hereinafter, a method of manufacturing the UV light-emitting-device package according to the present exemplary embodiment will be described.

First, the metal substrate 210 having the first surface 212 and the second surface 214, and the cavity 250 provided in the first surface 212 may be prepared. For example, the metal substrate 210 may be directly molded and formed by a die casting method, or may also be formed by processing the cavity 250 in a plane type. Next, the light emitting device 50 may be mounted on the bottom surface 218 within the cavity 250 with the adhesive member 55 interposed therebetween.

An operation of forming the insulating layers 220 and 225, an operation of forming the electrodes 230 and 235, and an operation of forming the bonding wires 240 and 245, which are sequentially performed, may refer to the operation of forming the insulating layers 120 and 125, an operation of forming the electrodes 130 and 135, and an operation of forming the bonding wires 140 and 145, which are described with reference to FIGS. 1 and 2.

Figure 7:
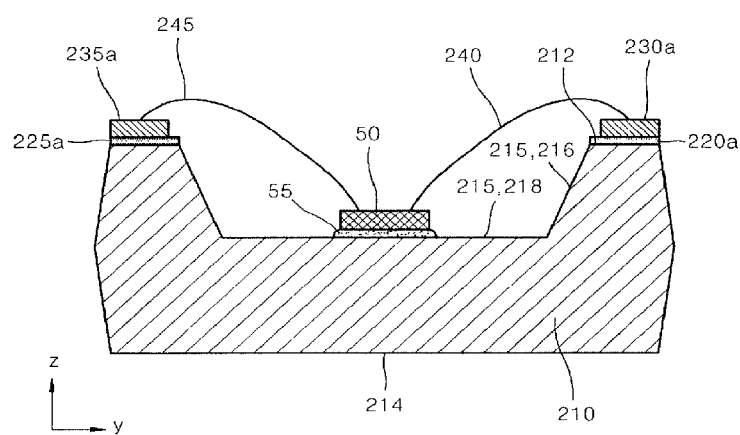
FIG. 7 is a schematic cross-sectional view illustrating a light-emitting-device package according to still yet another exemplary embodiment of the present invention.

FIG. 7 is a schematic cross-sectional view illustrating a light-emitting-device package according to still yet another exemplary embodiment of the present invention. Some configurations of the light-emitting-device package according to the present exemplary embodiment are modified from the UV light-emitting-device package of FIGS. 5 and 6, so that overlapping descriptions in the two exemplary embodiments will be omitted.

Referring to FIG. 7, a metal substrate 210 may include a bent portion on a lateral wall thereof, and insulating layers 220a and 225b and electrodes 230a and 235b may be disposed at an edge portion on a first surface 212 of the metal substrate 210.

Figure 8:
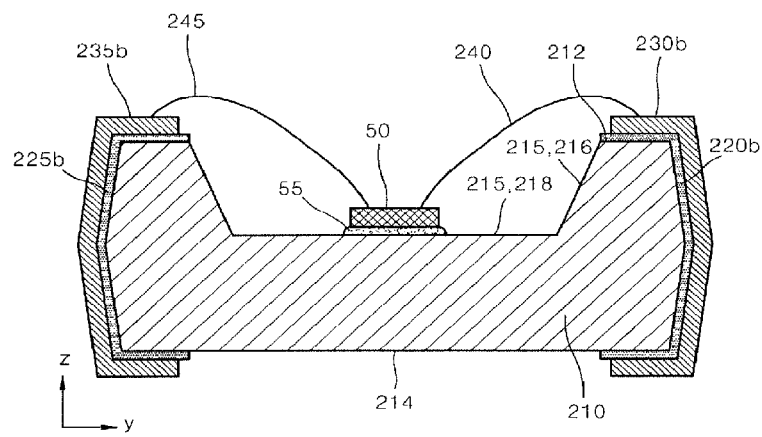
FIG. 8 is a schematic cross-sectional view illustrating a light-emitting-device package according to a further exemplary embodiment of the present invention.

FIG. 8 is a schematic cross-sectional view illustrating a light-emitting-device package according to a further exemplary embodiment of the present invention. Some configurations of the light-emitting-device package according to the present exemplary embodiment are modified from the UV light-emitting-device package of FIGS. 5 and 6, so that overlapping descriptions in the two exemplary embodiments will be omitted.

Referring to FIG. 8, a metal substrate 210 may include a bent portion on a lateral wall thereof, and insulating layers 220b and 225b and electrodes 230b and 235b may be extended from a first surface 212 of the metal substrate 210 onto a second surface 214 that is an opposite side of the first surface 212. For example, the insulating layers 220b and 225b and the electrodes 230b and 235b may be extended from an edge portion of the first surface 212 of the metal substrate 210 onto an edge portion of the second surface 214 through a lateral surface of the metal substrate 110. By the configuration, when the UV light-emitting-device package is mounted on a hoard, such as a printed circuit board, portions of the electrodes 230b and 235b extended onto the second surface 214 may be contact points for connecting the printed circuit board and the package. Accordingly, the UV light-emitting-device package according to the present exemplary embodiment may be mounted and modulated in the printed circuit board, and the like without an additional connection means.

Figure 9:
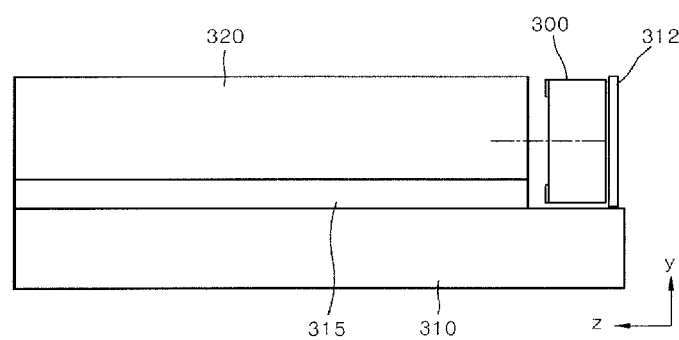
FIG. 9 is a conceptual diagram schematically illustrating a backlight module according to another further exemplary embodiment of the present invention.

FIG. 9 is a conceptual diagram schematically illustrating a backlight module according to another further exemplary embodiment of the present invention.

Referring to FIG. 9, a reflective sheet 315 may be provided on a part of a substrate 310, and a light guide plate 320 may be disposed on the reflective sheet 315. A UV light-emitting-device package 300 may be stacked on another part of the substrate 310. For example, the UV light-emitting-device package 300 may be one of the UV light-emitting-device packages of FIGS. 1 to 8. The UV light-emitting-device package 300 may be connected to a printed circuit board 312 to be mounted on the substrate 310.

For example, the substrate 310 may include a printed circuit board in which a predetermined circuit wire is formed. The printed circuit board included in the case does not exist only under the light-emitting-device package 300, but may be expanded up to a lower side of the reflective sheet 315, and may not be expanded up to the lower side of the reflective sheet 315, but may exist only on a lateral surface of the reflective sheet 315.

Figure 11:
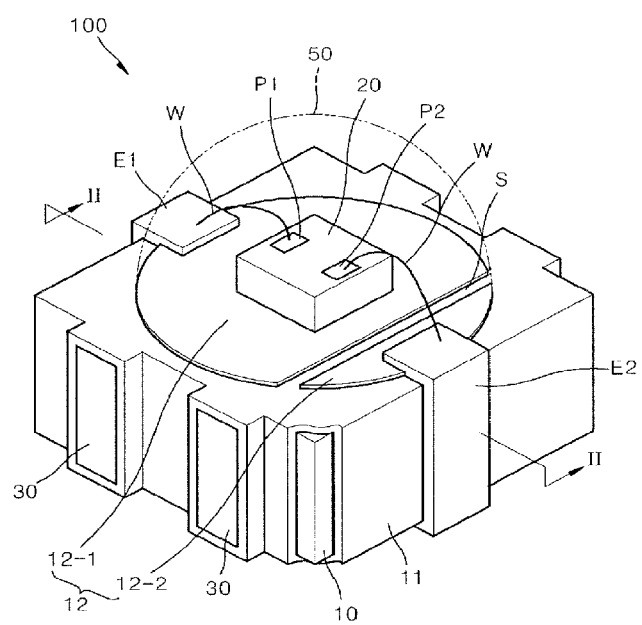
FIG. 11 is an exploded perspective view illustrating a part of a light-emitting-device package according to some exemplary embodiments of the present invention.

FIG. 11 is an exploded perspective view illustrating a part of a light-emitting-device package 100 according to some exemplary embodiments of the present invention. Further, FIG. 12 is a cross-sectional view taken along line II-II of the light-emitting-device package 100 of FIG. 11, and FIG. 13 is a top plan view illustrating the light-emitting-device package 100 of FIG. 11.

Figure 12:
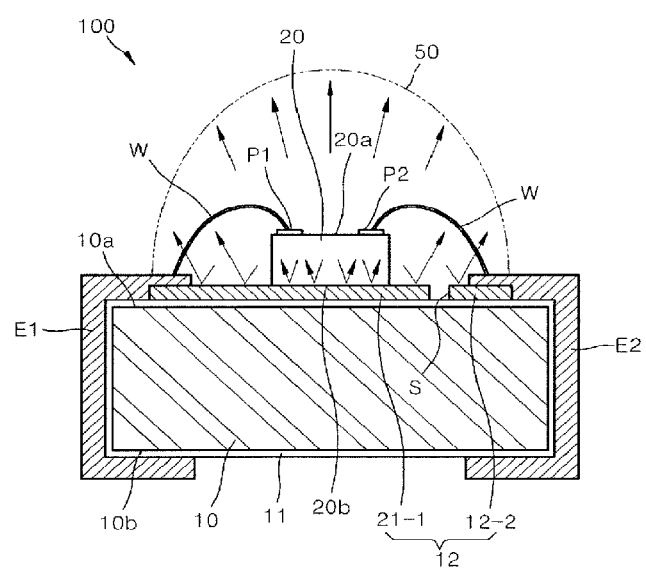
FIG. 12 is a cross-sectional view taken along line II-II of the light-emitting-device package of FIG. 11.
Figure 13:
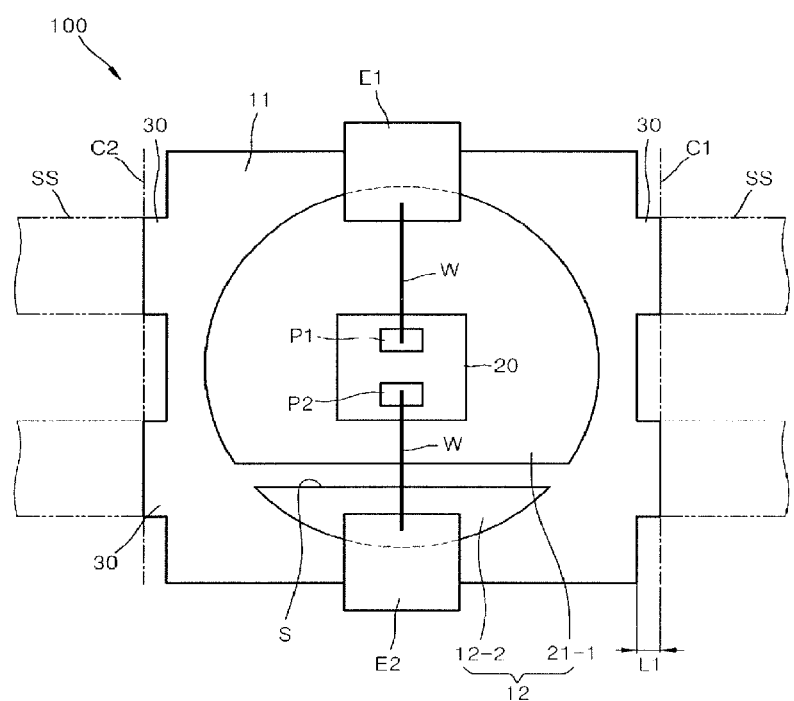
FIG. 13 is a top plan view illustrating the light-emitting-device package of FIG. 11.

First, as illustrated in FIGS. 11 to 13, the light-emitting-device package 100 according to some exemplary embodiments of the present invention may generally include a metal substrate 10, an insulating layer 11, an aluminum reflective layer 12, a first electrode layer E1, a second electrode layer E2, and a light emitting device 20. The light emitting device 20 may emit at least UV light.

Here, the metal substrate 10 may accommodate the light emitting device 20, and is electrically insulated from the light emitting device 20 by the insulating layer 11, so that the metal substrate 10 may be formed of a material having appropriate mechanical strength so as to support the light emitting device 20.

For example, a metal substrate, such as aluminum, copper, zinc, tin, lead, gold, and silver, which has excellent thermal conductivity and may be insulation-processed, and metal plates shaped like a plate or a lead frame may be applied to the metal substrate 10.

Further, the metal substrate 10 may be a flexible printed circuit board (FPCB) formed of a flexible material.

In addition, the metal substrate 10 may not only include a metal, and may partially include a synthetic resin, such as resin, glass, and epoxy or a ceramic material considering thermal conductivity, and may include one or more materials selected from an epoxy mold compound (EMC), polyimide (PI), graphene, synthetic glass fiber, and combinations thereof in order to improve processibility.

Further, the insulating layer 11 is an insulator surrounding the metal substrate 10, and may be formed by oxidizing the metal substrate 10. When the metal substrate 10 includes aluminum among the metals, the insulating layer 11 may include alumina that is an aluminum oxide. Various methods may be applied to the oxidization method, but the insulating layer 11 may be formed by oxidizing an aluminum component on the surface of the metal substrate 10 by using the anodizing method. That is, here, the metal substrate 10 may include an aluminum component, and the insulating layer 11 may be an aluminum oxide layer. In this case, the insulating layer 11 may be entirely formed on the whole surface of the metal substrate 10, and in addition, the insulating layer 11 may be entirely formed except for a part fixing the metal substrate 10 for oxidization work. In addition, the insulating layer 11 may be formed of a silicon oxide, a silicon nitride, and the like, and formed by using a printing method, such as a jet printing method.

Further, as illustrated in FIGS. 11 to 13, the aluminum reflective layer 12 may be a reflective layer installed at an area of at least 170% or more of a light emitting device seating part of the insulating layer 11.

Here, the light emitting device seating part may refer to a whole upper surface of the metal substrate 10 on which the light emitting device 20 is seated.

Particularly, aluminum among the metals shows generally reflectance of about 85% or more with respect to light including UV light, so that aluminum belongs to a metal having high reflectance. Further, reflectance of copper is about 59% and reflectance of alumina is about 30%, so that the reflectance of copper and alumina is lower than the reflectance of the aluminum. Accordingly, it may be advantageous that the aluminum reflective layer 12 including aluminum having relatively high reflectance is installed on the insulating layer 11, and areas of the insulating layer 11, the first electrode layer E1, and the second electrode layer E2 having relatively low reflectance are minimized.

In the meantime, a metal material generally has high reflectance with respect to a long wavelength than a short wavelength. Aluminum also has high reflectance with respect to a long wavelength than a short wavelength, but when a graph is drawn with a horizontal axis that is an axis along which a wavelength is increased and a vertical axis indicating reflectance, an inclination of aluminum is smaller than those of other general metals. This means that reflectance of aluminum with respect to a short wavelength is relatively high than reflectance of other metal materials.

Accordingly, in a case where the light emitting device 20 mainly emits light of a short wavelength, the metal substrate 10 includes aluminum, and the aluminum reflective layer 12 is formed as described above, thereby remarkably improving reflectance. In this case, the light emitting device 20 may include a UV LED capable of emitting light including a wavelength of 100 nm or more and 420 nm or less, which is a short wavelength.

Here, the light emitting device 20 does not essentially emit only light of a short wavelength, but may emit light of a long wavelength, but may mainly emit far UV light of a wavelength of 100 nm or more and 420 nm or less, particularly, 200 to 380 nm.

Further, a thermal compression processing method, a plating processing method, a bonding processing method, a sputtering processing method, other etching processing methods, a printing processing method, a spray processing method, and the like may be used as the method of forming the aluminum reflective layer 12.

Further, the aluminum reflective layer 12 may be generally formed around a rear surface 20b of the light emitting device 20 in a circular shape so as to reflect light generated by the light emitting device 20 as illustrated in FIGS. 11 and 13.

Further, as illustrated in FIG. 12, the aluminum reflective layer 12 may be installed between the first electrode layer E1 and the insulating layer 11 so as to be electrically connected with the first electrode layer E1.

Further, as illustrated in FIGS. 11 and 13, the aluminum reflective layer 12 may be provided with an electrode separation line S at a center portion of the aluminum reflective layer 12 so as to be insulated from the second electrode layer E2, and may include a first reflective layer 12-1 installed at one side and a second reflective layer 12-2 installed at the other side based on the electrode separation line S.

Accordingly, the first reflective layer 12-1 of the aluminum reflective layer 12 may be shaped like a circle of which a part is cut by the electrode separation line S, and the second reflective layer 12-2 of the aluminum reflective layer 12 may be shaped like a remaining circle.

Here, the aluminum reflective layer 12 may be installed at an area of 170% or more of the light emitting device seating part, and it may be advantageous that the aluminum reflective layer 12 is installed at a maximum area of a portion, except for the electrode separation line S, the first electrode layer E1, and the second electrode layer E2.

Further, the first reflective layer 12-1 may be electrically connected with the first electrode layer E1, and the second reflective layer 12-2 may be electrically connected with the second electrode layer E2. Here, the first reflective layer 12-1 and the second reflective layer 12-2 of the aluminum reflective layer 12 may be insulated from each other by the electrode separation line S formed therebetween.

However, the shape of the aluminum reflective layer 12 of the light-emitting-device package 100 according to some exemplary embodiments of the present invention is not essentially limited to FIGS. 11 to 13.

Figure 14:
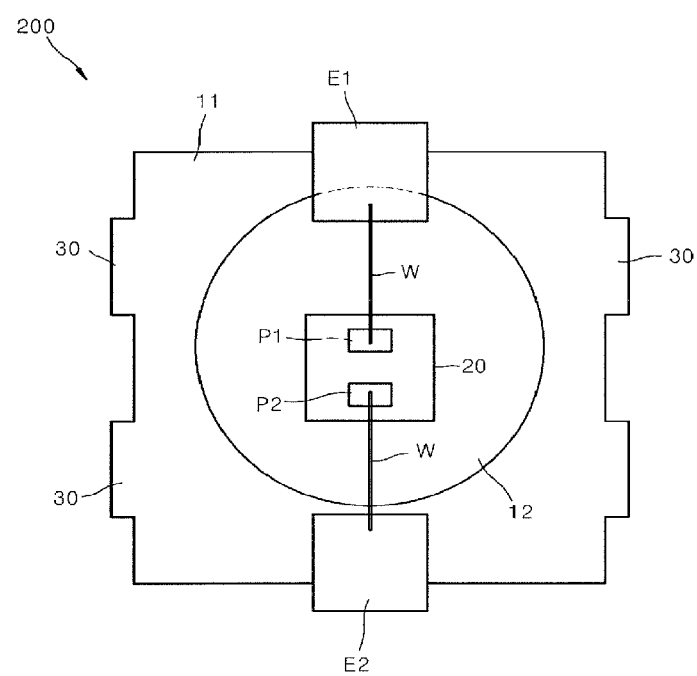
FIG. 14 is a top plan view illustrating a light-emitting-device package according to some other exemplary embodiments of the present invention.

FIG. 14 is a top plan view illustrating a light-emitting-device package 200 according to some other exemplary embodiments of the present invention.

As illustrated in FIG. 14, an aluminum reflective layer 12 of the light-emitting-device package 200 according to some other exemplary embodiments of the present invention may be a form in which the aforementioned first reflective layer 12-1 and second reflective layer 12-2 are combined in one circular shape without necessity of forming a separate electrode separation line S.

Figure 15:
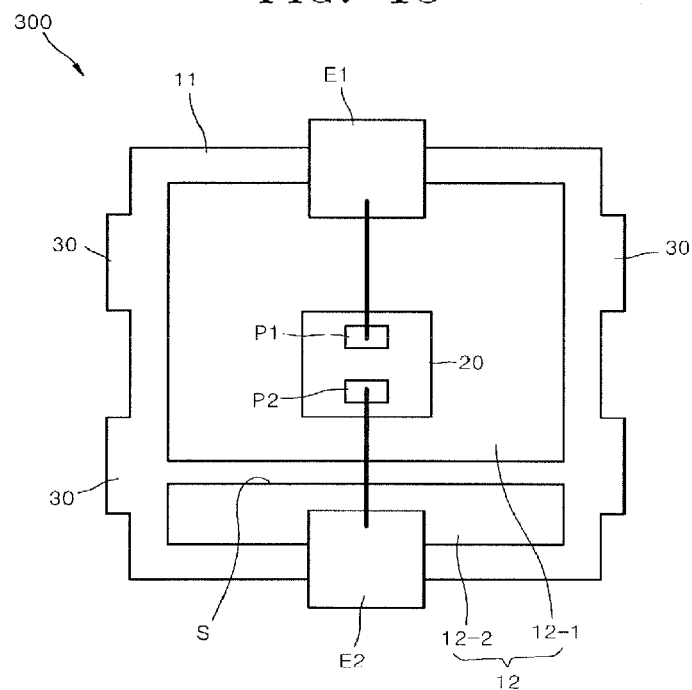
FIG. 15 is a top plan view illustrating a light-emitting-device package according to some other exemplary embodiments of the present invention.

FIG. 15 is a top plan view illustrating a light-emitting-device package 300 according to some other exemplary embodiments of the present invention.

As illustrated in FIG. 15, an aluminum reflective layer 12 of the light-emitting-device package 300 according to some other exemplary embodiments of the present invention may include a first reflective layer 12-1 generally shaped like a quadrangle and a second reflective layer 12-2 generally shaped like a quadrangle, based on an electrode separation line S.

In addition, the aluminum reflective layer 12 may have various shapes, such as an elliptical shape, a polygonal shape, a combined shape, and various geometric shapes, as well as a circular shape and a quadrangular shape, and the electrode separation line S may also be formed in very various shapes, such as a curve shape, a bent shape, and a waveform, not a straight shape, or may be omitted.

Further, as illustrated in FIGS. 11 to 13, the first electrode layer E1 is installed at one side of the insulating layer 11, and the second electrode layer E2 is installed at the other side of the insulating layer 11, and the first electrode layer E1 is formed on the insulating layer 11 in a shape extended from one side of a front surface 10a of the metal substrate 10 onto one side of a rear surface 10b of the metal substrate 10, and the second electrode layer E2 is formed on the insulating layer 11 in a shape extended from the other side of the front surface 10a of the metal substrate 10 to the other side of the rear surface 10b of the metal substrate 10.

Here, the first electrode layer E1 and the second electrode layer E2 may be installed in a form of a wire layer of a conductive layer pattern. The wire layer may be formed of one or more selected from copper, aluminum, and a combination thereof having excellent thermal conductivity and relatively cheap.

In this case, a thermal compression processing method, a plating processing method, a bonding processing method, a sputtering processing method, other etching processing methods, a printing processing method, a spray processing method, and the like may be used as a method of forming the pattern.

In the meantime, as illustrated in FIGS. 11 to 15, the light emitting device 20 may be a UV LED which is seated on the light emitting device seating part, is electrically connected with the first electrode layer E1 and the second electrode layer E2, and emits UV light including a wavelength of 100 nm or more and 420 nm or less.

Here, a first electrode pad P1 and a second electrode pad P2, to which wires W may be connected, may be formed on a front surface 20a of the light emitting device 20, and an insulating bonding medium may be installed on a rear surface 20b of the light emitting device 20.

Further, the light emitting device 20 may have a horizontal shape, a vertical shape, or a flip chip shape requiring no wire W. The light emitting device 20 may be provided with various bumps or a signal transmitting medium, such as a solder, and various types of light emitting device may be applied to the light emitting device 20.

Further, the light emitting device 20 may be seated on the metal substrate 10, and FIG. 11 illustrates a state where one light emitting device 20 is seated on the metal substrate 10, but in addition, a plurality of light emitting devices 20 may be seated on the metal substrate 10.

The light emitting device 20 may be formed of a semiconductor. For example, an LED which is formed of a nitride semiconductor and emits UV light, and the like may be applied to the light emitting device 20. The nitride semiconductor may be expressed by the Formula, $Al_xGa_yIn_zN$ ($0 \leq x \leq 1$, $0 \leq y \leq 1$, $0 \leq z \leq 1$, $x+y+z=1$).

Further, the light emitting device 20 may be configured, for example, by epitaxially growing a nitride semiconductor, such as InN, AlN, InGaN, AlGaN, and InGaAlN, on a sapphire substrate or a silicon carbide substrate for growing by a vapor growing method, such as metal organic chemical vapor deposition (MOCVD) method. Further, the light emitting device 20 may be formed of a semiconductor, such as ZnO, ZnS, ZnSe, SiC, GaP, GaAlAs, and AlInGaP, in addition to the silicon semiconductor. A stack structure, in which an n-type semiconductor layer, a light emitting layer, and a p-type semiconductor layer are sequentially formed, may be used as the semiconductor. A stacked semiconductor including a multi quantum well structure or a single quantum well structure or a stacked semiconductor having a double hetero structure may be used as the light emitting layer (active layer). Further, a device having a predetermined wavelength may be selected as the light emitting device 20 according to a use, such as a display use or a lighting use.

Here, an insulating substrate, a conductive substrate, or a semiconductor substrate may be used as the substrate for growing as necessary. For example, the substrate for growing may be sapphire, SiC, Si, $MgAl_2O_4$, MgO, $LiAlO_2$, $LiGaO_2$, and GaN. In order to epitaxially growing a GaN material, a GaN substrate that is a homogeneous substrate may be used, but there is a problem in that it is difficult to manufacture a GaN substrate, so that production cost of the GaN substrate becomes high.

Further, a sapphire substrate, a silicon carbide (SiC) substrate, and the like are mainly used as the heterogeneous substrate, and a sapphire substrate is more widely utilized than an expensive silicon carbide substrate. When the heterogeneous substrate is used, a defect, such as dislocation, is increased due to a difference in a lattice constant between a substrate material and a thin film material. Further, warpage is generated when a temperature is changed due to a difference in a thermal expansion coefficient between a substrate material and a thin film material, and the warpage causes cracks of the thin film. The aforementioned problem may also be decreased by using a buffer layer between the substrate and the GaN based light emitting stack structure.

Further, in order to improve an optical or electrical characteristic of an LED chip before or after growing an LED structure, the substrate for growing may be completely or partially removed or patterned during a chip manufacturing process.

For example, a sapphire substrate may be separated by irradiating laser to an interface with the semiconductor layer through the substrate, and a silicon or silicon carbide substrate may be removed by a method, such as polishing/etching.

Further, when the substrate for growing is removed, another supporting substrate may be used, and in order to improve light efficiency of an LED chip at an opposite side of the original substrate for growing, the supporting substrate may be bonded by using a reflective metal or a reflective structure may be inserted into a center of an adhesive layer.

Further, patterning of the substrate for growing forms concave-convex portions or an inclined surface on a main surface (a surface or both surfaces) or a lateral surface of the substrate before or after an LED structure is grown, thereby improving light extraction efficiency. A size of pattern may be selected from a range of 5 nm to 500 μm, and as long as a regular or irregular pattern has a structure for improving light extraction efficiency, the regular or irregular pattern may be available. The pattern may adopt various shapes, such as a pillar, a mountain, a hemisphere shape, or a polygonal shape.

The sapphire substrate is a crystal having hexa-Rhombo R3c symmetry, has lattice constants in a c-axis direction and an a-axis direction of 13.001 and 4.758, respectively, and has a surface C, a surface A, a surface R, and the like. In this case, the surface C comparatively easily grows a nitride thin film and is stable at a high temperature, so that the surface C is mainly used as a substrate for growing a nitride.

Further, another material of the substrate for growing may be a Si substrate, and is more appropriate for a large aperture and is relatively cheap, so that mass production may be improved.

Further, the silicon (Si) substrate absorbs light generated by the GaN based semiconductor, so that external quantum efficiency of the light emitting device is decreased, and thus the metal substrate is removed and the supporting substrate, such as a Si, Ge, SiAl, ceramic, or metal substrate including a reflective layer is additionally formed and used as necessary.

When a GaN thin film is grown on a heterogeneous substrate, such as the Si substrate, a dislocation density may be increased due to discordance of a lattice constant between a substrate material and a thin film material, and cracking and warpage may be generated due to a difference in a thermal expansion coefficient. A buffer layer may be disposed between the substrate for growing and the light emission stack structure for the purpose of preventing dislocation and cracks of the light emission stack structure. The buffer layer serves to adjust a warpage degree of the substrate when the active layer is grown and decrease a wavelength distribution of a wafer.

Here, the buffer layer may use $Al_xIn_yGa_{1-x-y}N$ ($0 \leq x \leq 1$, $0 \leq y \leq 1$, $x+y \leq 1$), particularly, GaN, AlN, AlGaN, InGaN, or InGaNAlN, and may also use a material, such as $ZrB_2$, $HfB_2$, ZrN, HfN, and TiN as necessary. Further, the buffer layer may also be used by combining a plurality of layers or gradually changing a composition thereof.

In the meantime, as illustrated in FIG. 13, marginal protrusions 30 protruding by a marginal length L1 from a lateral surface of the metal substrate 10 may be formed at a lateral side of the metal substrate 10 so as to prevent cracks of the insulating layer 11 from being spread when the individual metal substrate 10 is cut from a substrate strip SS.

Accordingly, when the substrate strip SS is cut along cut lines C1 and C2 by using cutting equipment, even though cracks are generated at a part of the insulating layer 11, the cracks only stay in regions around the marginal protrusions 30, so that it is possible to prevent the cracks from being spread up to the insulating layer 11 on the metal substrate 10 and prevent a defect, such as a short-circuit, from being generated.

Figure 21:
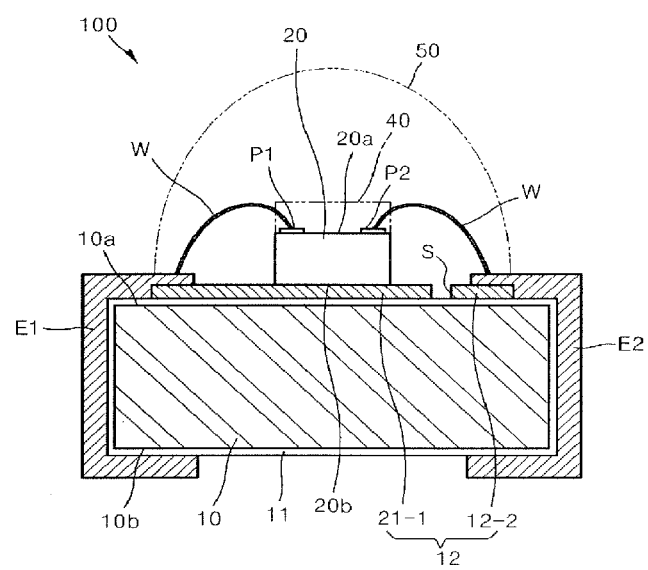

In the meantime, as illustrated in FIG. 21, a fluorescent substance 40 may be installed around the light emitting device 20. The fluorescent substance 40 may have a composition formula and colors represented below.

Oxide-basis: Yellow and green $Y_3Al_5O_{12}$:Ce, $Tb_3Al_5O_{12}$:Ce, $Lu_3Al_5O_{12}$:Ce Silicate-basis: Yellow and green $(Ba,Sr)_2SiO_4$:Eu, yellow and orange $(Ba,Sr)_3SiO_5$:Ce Nitride-basis: Green β-SiAlON:Eu, yellow $L_3Si_6O_{11}$Ce, orange α-SiAlON:Eu, red $CaAlSiN_3$:Eu, $Sr_2Si_5N_8$:Eu, $SrSiAl_4N_7$:Eu The composition of the fluorescent substance 40 basically needs to be in accordance with stoichiometry, and respective elements are capable of being substituted with other elements within respective groups of the periodic table. For example, Sr may be substituted with Ba, Ca, Mg, and the like within an alkaline earth(II) group, and Y may be substituted with Tb, Lu, Sc, Gd, and the like based on lanthanum. Further, Eu and the like, which are activators, may be substituted with Ce, Tb, Pr, Er, and Yb according to a desired energy level, and the activator may be solely applied or a sub activator and the like may be additionally applied for transforming a characteristic.

Further, materials, such as quantum dot (QD), may be applied as a substituent material of the fluorescent substance 40, and the fluorescent substance 40 and the QD may be mixed and used or separately used in the LED.

The QD may be formed in a structure including a core (3 to 10 nm) of CdSe, InP, and the like, a shell (0.5 to 2 nm) of ZnS, ZnSe, and the like, and a regand for stabilizing the core and the shell, and may implement various colors according to a size thereof.

Further, a method of applying the fluorescent substance 40 or the quantum dot may use at least one of a method of spraying the fluorescent substance 40 or the quantum dot onto the LED chip or the light emitting device, a method of covering the LED chip or the light emitting device with the fluorescent substance 40 or the quantum dot in a film type, and a method of attaching a film or sheet type ceramic fluorescent substance or the like onto the LED chip or the light emitting device.

The spraying method generally includes dispensing, spray coating, and the like, and the dispensing includes a pneumatic method, a mechanical method, such as a screw type and a linear type. It is possible to control the amount of dotting through discharge of a tiny amount and control a color coordinate through the control by a jetting method. A method of applying a fluorescent substance on a wafer level or a light emitting device substrate in a lump by a spray method may be easy to control productivity and a thickness.

An electrophoretic method, a screen printing method, or a fluorescent molding method may be applied to the method of directly covering the light emitting device 20 or the LED chip with the fluorescent substance 40 or the quantum dot in a film type, and the corresponding method may be different according to whether it is necessary to apply the fluorescent substance or the quantum dot onto the lateral surface of the LED chip.

In order to control efficiency of a long wavelength light emitting fluorescent substance, which re-absorbs light emitted at a short wavelength, among the two or more types of fluorescent substances having different light emission wavelengths, it is possible to divide two or more types of fluorescent substance layers having different light emission wavelengths, and in order to minimize wavelength re-absorption and interference of the LED chip and the two or more types of fluorescent substances, a DBR (ODR) layer may be included between the respective layers.

In order to form a uniform coating layer, the fluorescent substance may be manufactured in a film type or a ceramic type, and then attached onto the LED chip or the light emitting device.

In order to make a difference in light efficiency and a light distribution characteristic, an optical conversion material may be positioned by a remote type, and in this case, the optical conversion material is positioned together with a material, such as alight transmissive polymer and glass, according to durability and heat resistance.

The technique of applying the fluorescent substance 40 is most important in determining a light characteristic in the light emitting device, so that control techniques for a thickness of a fluorescent substance applied layer, uniform distribution of a fluorescent substance, and the like have been variously researched. The QD may also be positioned on the LED chip or the light emitting device by the same method as that of the fluorescent substance, and the QD may be positioned between glass or light transmissive polymer materials to convert light.

Further, as illustrated in FIGS. 12 and 21, a lens 50 may be installed around the light emitting device 20.

Here, the lens 50 may guide a path of UV light generated by the light emitting device 20, and glass, a epoxy resin composition, a silicon resin composition, a modified epoxy resin composition, such as a silicon modified epoxy resin, a modified silicon resin composition, such as an epoxy modified silicon resin, a polyimide resin composition, a modified polyimide resin composition, polyphthalamide (PPA), a polycarbonate resin, a polyphenylene sulfide (PPS), a liquid crystal polymer (LCP), an ABS resin, a phenol resin, an acrylic resin, a PBT resin, and the like may be applied to the lens 50.

Further, although not illustrated in the drawing, in addition to the lens 50, various types of component, such as various reflection members, a light transmissive encapsulation material, and a light non-transmissive encapsulation material, may be installed around the light emitting device 20.

In the meantime, although not illustrated in the drawings, a light-emitting-device package according to some exemplary embodiments of the present invention may include a metal substrate 10, an insulating layer 11 surrounding the metal substrate 10, a light emitting device 20 seated on a light emitting device seating part of the insulating layer 11, a first electrode layer E1 installed at one side of the insulating layer 11 and electrically connected with the light emitting device 20, a second electrode layer E2 installed at the other side of the insulating layer 11 and electrically connected with the light emitting device 20, and marginal protrusions 30 installed at a lateral side of the metal substrate 10 and protruding by a marginal length L1 from a lateral surface of the metal substrate 10 in a lateral direction so as to prevent cracks of the insulating layer 11 when the individual metal substrate 10 is cut from a substrate strip SS. Here, the metal substrate 10, the insulating layer 11, the light emitting device 20, the first electrode layer E1, the second electrode layer E2, and the marginal protrusion 30 may have the same configurations and perform the same functions as those described with reference to FIGS. 11 to 15. Accordingly, detailed descriptions thereof will be omitted. Accordingly, the light-emitting-device packages according to some or some other exemplary embodiments of the present invention do not essentially include the aforementioned aluminum reflective layer 12.

FIGS. 16 to 21 are cross-sectional views sequentially illustrating a manufacturing process of the light-emittingdevice package 100 according to some exemplary embodiments of the present invention.

Figure 16:
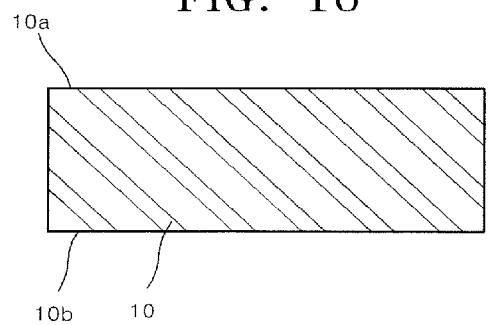
FIGS. 16 to 21 are cross-sectional views sequentially illustrating a manufacturing process of the light-emitting-device package according to some exemplary embodiments of the present invention.

Referring to FIGS. 16 to 21, first, as illustrated in FIG. 16, the metal substrate strip SS formed of an aluminum material in which the individual metal substrates 10 are connected with each other may be prepared.

In this case, the metal substrate strip SS may have a form in which the plurality of metal substrates 10 of FIG. 13 is disposed in a matrix form and connected with each other by bridges and the like formed on lateral surfaces of the metal substrates 10.

Figure 17:
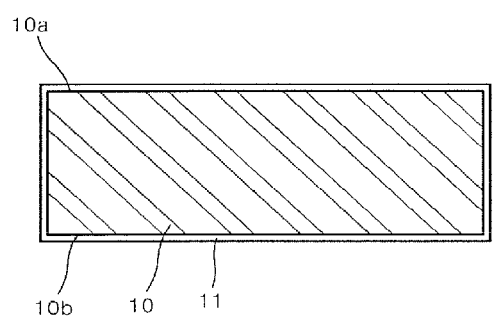

Next, as illustrated in FIG. 17, the alumina insulating layer 11 that is an aluminum oxide may be formed by oxidizing the metal substrate strip SS so that the insulating layer 11 is formed in the metal substrate strip SS.

Figure 18:
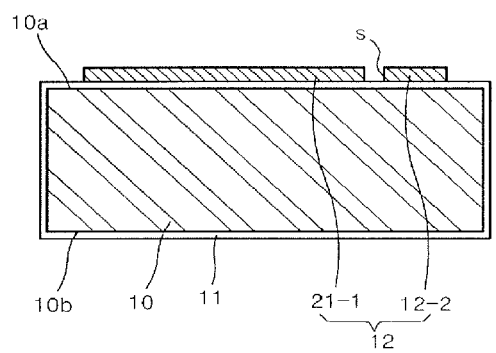

Next, as illustrated in FIG. 18, the aluminum reflective layer 12 may be installed on the light emitting device seating part of the insulating layer 11.

Here, the aluminum reflective layer 12 may be installed on the insulating layer 11 by a thermal compression processing method, a plating processing method, a bonding processing method, a sputtering processing method, other etching processing methods, a printing processing method, a spray processing method, and the like.

Figure 19:
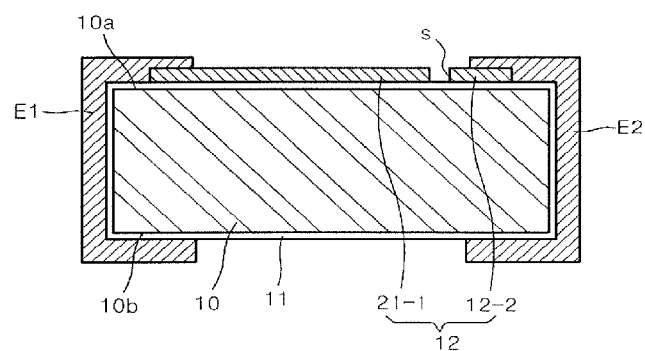

Next, as illustrated in FIG. 19, the first electrode layer E1 may be installed at one side of the insulating layer 11, and the second electrode layer E2 may be installed at the other side of the insulating layer 11.

Here, the first electrode layer E1 and the second electrode layer E2 may also be installed on the insulating layer 11 by a thermal compression processing method, a plating processing method, a bonding processing method, a sputtering processing method, other etching processing methods, a printing processing method, a spray processing method, and the like.

Figure 20:
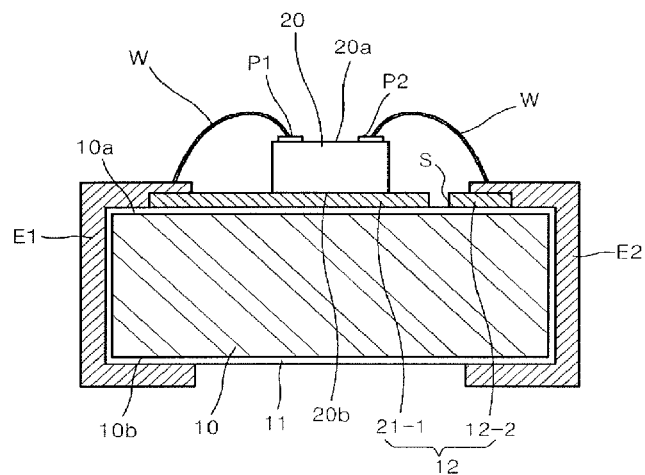

Next, as illustrated in FIG. 20, the light emitting device 20 is seated on the light emitting device seating part by using a die bonding apparatus, wiring equipment, and the like, and various signal transmission media, such as a wire S, may be installed in the light emitting device 20, the fluorescent substance 40 may be installed in the light emitting device 20, or the lens 50, other reflective members, an encapsulation material, and the like may be additionally installed in the light emitting device 20.

Next, as illustrated in FIG. 21, the metal substrate strip SS may be cut by using cutting equipment so that the marginal protrusions 30 protruding by the marginal length L1 from the lateral surface of the metal substrate 10 in a lateral direction may be formed at the lateral side of the metal substrate strip SS in order to prevent cracks of the insulating layer 11.

Figure 22:
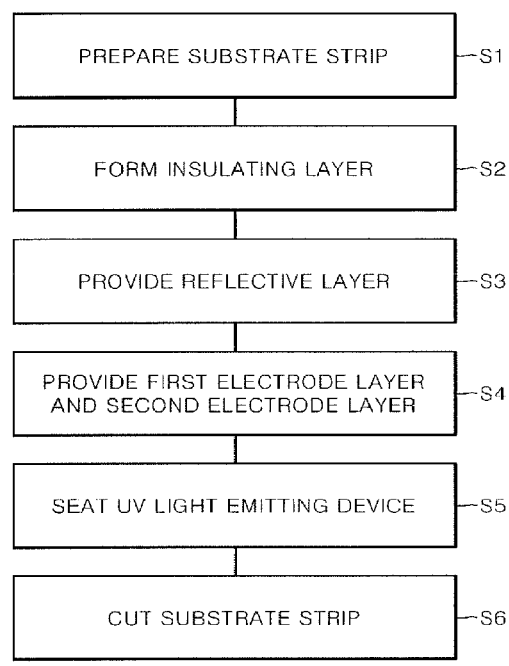
FIG. 22 is a flowchart illustrating a method of manufacturing the light-emitting-device package according to some exemplary embodiments of the present invention.

FIG. 22 is a flowchart illustrating a method of manufacturing the light-emitting-device package 100 according to some exemplary embodiments of the present invention.

As illustrated in FIGS. 16 to 22, the method of manufacturing the light-emitting-device package 100 according to some exemplary embodiments of the present invention may include an operation S1 of preparing the metal substrate strip SS formed of the aluminum material, in which the individual metal substrates 10 are connected with each other, an operation S2 of oxidizing the metal substrate strip SS so that the insulating layer 11 is formed on the metal substrate strip SS, an operation S3 of installing the aluminum reflective layer 12 on the light emitting device seating part of the insulating layer 11, an operation S4 of installing the first electrode layer E1 at one side of the insulating layer 11 and installing the second electrode layer E2 at the other side of the insulating layer 11, an operation S5 of seating the light emitting device on the light emitting device seating part, and an operation S6 of cutting the metal substrate strip SS so that the marginal protrusions 30 protruding by the marginal length L1 from the lateral surface of the metal substrate 10 in a lateral direction may be formed at the lateral side of the metal substrate strip SS in order to prevent cracks of the insulating layer 11.

Here, the operation S3 of installing the aluminum reflective layer 12 on the light emitting device seating part of the insulating layer 11 may be performed after the operation S4 of installing the first electrode layer E1 at one side of the insulating layer 11 and installing the second electrode layer E2 at the other side of the insulating layer 11.

In the meantime, although not illustrated in the drawing, a backlight unit including the light-emitting-device package 100 according to some exemplary embodiments of the present invention may further include a light guide plate in addition to the aforementioned configurations.

The backlight unit is installed in an LCD panel and allows light to pass through in a direction of the LCD panel, and may be installed in a path of light generated by the light emitting device 20 and transmit the light generated by the light emitting device 20 to a wider area.

Further, although not illustrated in the drawing, a polycarbonate-based material, a polysulphone-based material, a polyacrylate-based material, a polystyrene-based material, a polyvinyl chloride-based material, a polyvinyl alcohol-based material, a polynorbonene-based material, a polyester, and the like may be applied as a material of the light guide plate, and in addition, various light transmissive resin-based materials may be applied as the material of the light guide plate. Further, the light guide plate 50 may be formed by various methods, such as a method of forming micro patterns, micro protrusions, a diffusion layer, and the like on a surface thereof or a method of forming micro bubbles therein.

The backlight unit according to some exemplary embodiments of the present invention may be a direct type backlight unit in which the light emitting device 20 is installed at a lower side of the light guide plate, or an edge type backlight unit in which the light emitting device 20 is installed at a lateral side of the light guide plate.

In the meantime, although not illustrated in the drawing, the light-emitting-device package 100 according to an exemplary embodiment of the present invention may be used in various devices, such as a UV curing device, a UV sterilizing device, or a technical field in which UV light may be used.

The present invention has been described with reference to the exemplary embodiments illustrated in the drawings, but the exemplary embodiments are only illustrative, and it would be appreciated by those skilled in the art that various modifications and equivalent exemplary embodiments may be made. Therefore, the true technical scope of the present should be defined by the technical spirit of the appended claims.

The invention claimed is:

1. A light emitting device package, comprising:
   a substrate comprising a first surface and a second surface opposed to the first surface;
   an aluminum reflective layer formed over the first surface; and
   a light emitting device mounted on the aluminum reflective layer with an adhesive member interposed therebetween, wherein the light emitting device emits ultraviolet light in a wavelength range from 200 nm to 380 nm, and wherein the aluminum reflective layer comprises a first part on which the light emitting device mounts and a second part which is separated from the first part by a separation line.

2. The light emitting device package of claim 1, wherein the aluminum reflective layer is in a substantially circular shape, a substantially quadrangular shape or a substantially elliptical shape.

3. The light emitting device package of claim 1, wherein the separation line is in a substantially straight shape, a substantially curve shape or a substantially bent shape.

4. The light emitting device package of claim 1, wherein the substrate includes a metal substrate and an insulation layer is disposed on the metal substrate.

5. The light emitting device package of claim 2, wherein the metal substrate includes an aluminum component.

6. The light emitting device package of claim 2, wherein the insulation layer includes an aluminum oxide layer.

7. The light emitting device package of claim 1, wherein a fluorescent substance is installed around the light emitting device.

8. The light emitting device package of claim 1, further comprising a first electrode layer electrically connected to a first electrode pad of the light emitting device and a second electrode layer connected to a second electrode pad of the light emitting device.

9. The light emitting device package of claim 2, further comprising a first electrode layer disposed on the insulation layer and electrically connected to a first electrode pad of the light emitting device and a second electrode layer disposed on the insulation layer connected to a second electrode pad of the light emitting device.

10. The light emitting device package of claim 8, wherein the first electrode layer contacts with the first part of the aluminum reflective layer and the second electrode layer contacts with the second part of the aluminum reflective layer.

11. The light emitting device package of claim 10, wherein a portion of the first part of the aluminum reflective layer is disposed between a portion of the first electrode layer and the substrate.

12. The light-emitting-device package of claim 10, wherein a portion of the second part of the aluminum reflective layer is disposed between a portion of the second electrode layer and the substrate.

* * * * *